United States Patent
Omori et al.

(10) Patent No.: US 9,310,414 B2
(45) Date of Patent: Apr. 12, 2016

(54) ELECTRONIC APPARATUS, A METHOD FOR DECIDING A FAILURE, AND A METHOD FOR ESTIMATING A FATIGUE LIFE

(75) Inventors: Takahiro Omori, Kanagawa-ken (JP); Kenji Hirohata, Tokyo (JP); Tomoko Monda, Kanagawa-ken (JP); Kazuyo Narita, Tokyo (JP); Toshikatsu Akiba, Chiba-ken (JP); Akihiro Koga, Tokyo (JP); Katsumi Hisano, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 299 days.

(21) Appl. No.: 13/616,460

(22) Filed: Sep. 14, 2012

(65) Prior Publication Data

US 2013/0257450 A1 Oct. 3, 2013

(30) Foreign Application Priority Data

Mar. 27, 2012 (JP) ................. P2012-072516

(51) Int. Cl.
*G01R 31/00* (2006.01)
*G01R 31/02* (2006.01)
(Continued)

(52) U.S. Cl.
CPC .............. *G01R 31/026* (2013.01); *H01L 24/48* (2013.01); *G01R 31/3274* (2013.01); *H01L 24/45* (2013.01); *H01L 2224/45124* (2013.01); *H01L 2224/48137* (2013.01); *H01L 2224/49175* (2013.01); *H01L 2924/00014* (2013.01); *H01L 2924/1305* (2013.01); *H01L 2924/13055* (2013.01);
(Continued)

(58) Field of Classification Search
CPC ...................... G01R 31/024–31/026

USPC .......................... 324/500, 512, 525
See application file for complete search history.

(56) References Cited

U.S. PATENT DOCUMENTS 4,963,698 A * 10/1990 Chang et al. ................ 174/77 R
6,076,411 A * 6/2000 Horvath ......................... 73/866
(Continued)

FOREIGN PATENT DOCUMENTS

JP       10090349 A  *  4/1998
JP    2000097800 A  *  4/2000
(Continued)

OTHER PUBLICATIONS

Office Action, issued from the Japanese Patent Office in corresponding Patent Application No. 2014-126294, dated May 15, 2015, 4 pp.

*Primary Examiner* — Jermele M Hollington
*Assistant Examiner* — Demetrius Pretlow
(74) *Attorney, Agent, or Firm* — Finnegan, Henderson, Farabow, Garrett & Dunner, LLP

(57) ABSTRACT

According to one embodiment, in an electronic apparatus, a first pair of electrodes has a first electrode and a second electrode. A second pair of electrodes is disposed in parallel with the first pair, and has a third electrode and a fourth electrode. A third pair of electrodes is disposed between the first pair and the second pair in parallel with the first pair and the second pair, and has a fifth electrode and a sixth electrode. A first wire electrically connects the first electrode and the second electrode. A second wire electrically connects the third electrode and the fourth electrode. A third wire electrically connects the fifth electrode and the sixth electrode. A gel covers the first wire, the second wire, and the third wire. A first detection unit detects a break status of the first wire or the second wire.

7 Claims, 10 Drawing Sheets

(51) Int. Cl.
*H01L 23/00* (2006.01)
*G01R 31/327* (2006.01)

(52) U.S. Cl.
CPC . *H01L2924/1461* (2013.01); *H01L 2924/3011* (2013.01)

(56) References Cited

U.S. PATENT DOCUMENTS

2002/0161535 A1* 10/2002 Kawakita et al. ............. 702/42
2003/0197513 A1* 10/2003 Uematsu et al. ............ 324/522
2004/0124849 A1* 7/2004 Linzey ......................... 324/557
2005/0212549 A1* 9/2005 Matsubara et al. .......... 324/772
2005/0236617 A1 10/2005 Yamada
2008/0269970 A1* 10/2008 Yamada ......................... 701/21
2012/0169505 A1* 7/2012 Terasawa et al. ............ 340/635
2012/0213246 A1* 8/2012 Honbo et al. .................. 374/57

FOREIGN PATENT DOCUMENTS

JP 2003-282750 10/2003
JP 2005-311213 11/2005

* cited by examiner

ELECTRONIC APPARATUS, A METHOD FOR DECIDING A FAILURE, AND A METHOD FOR ESTIMATING A FATIGUE LIFE

CROSS-REFERENCE TO RELATED APPLICATION

This application is based upon and claims the benefit of priority from Japanese Patent Application No. 2012-072516, filed on Mar. 27, 2012; the entire contents of which are incorporated herein by reference.

FIELD

Embodiments described herein relate generally to an electronic apparatus, a method for deciding a failure, and a method for estimating a fatigue life.

BACKGROUND

A power module is used for an electronic apparatus (such as an in-vehicle equipment or an industrial equipment) which requires a switching with large electric current. As to the power module, an electric connection therein is performed by a plurality of wires. Furthermore, in order to prevent a short circuit due to contact between adjacent wires or to prevent degradation due to change of an environment such as moisture, a silicon gel covering the wire is potted in a housing of the power module.

However, under the environment in which a strong external force continually acts on the electronic apparatus, the silicon gel in the housing vibrates by an inertial force. By this vibration, an internal stress repeatedly acts on the wire. As a result, a bonding part between the wire and another part is often broken. Accordingly, in order to maintain a performance or a safety of the power module, improvement of reliability of electrical connection of the wire is desired.

DETAILED DESCRIPTION

According to one embodiment, an electronic apparatus includes a first pair of electrodes, a second pair of electrodes, a third pair of electrodes, a first wire, a second wire, a third wire, a gel, and a first detection unit. The first pair has a first electrode and a second electrode. The second pair is disposed in parallel with the first pair, and has a third electrode and a fourth electrode. The third pair is disposed between the first pair and the second pair in parallel with the first pair and the second pair, and has a fifth electrode and a sixth electrode. The first wire electrically connects the first electrode and the second electrode. The second wire electrically connects the third electrode and the fourth electrode. The third wire electrically connects the fifth electrode and the sixth electrode. The gel covers the first wire, the second wire, and the third wire. The first detection unit detects a break status of the first wire or the second wire.

Various embodiments will be described hereinafter with reference to the accompanying drawings.

The First Embodiment

Figure 1:
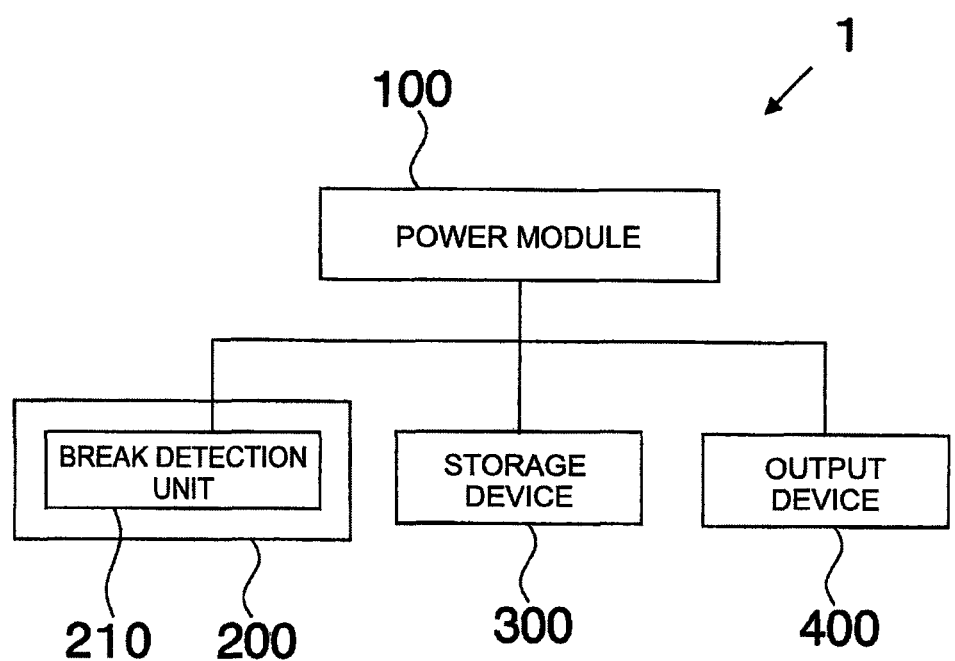
FIG. 1 is a block diagram of an electronic apparatus according to the first embodiment.

FIG. 1 is a block diagram of an electronic apparatus 1 according to the first embodiment. For example, the electronic apparatus 1 is an on-board Engine Control Unit (ECU).

As shown in FIG. 1, the electronic apparatus 1 includes a power module 100 having a switching function of electric current, a computation device 200 such as a CPU (Central Processing Unit) having a break detection unit 210 to detect a broken of a wire 50 in the power module 100, and a storage device 300 such as a non-volatile memory or a HDD (Hard Disk Drive). Furthermore, the electronic apparatus 1 includes an output device 400 (such as an alarm, a display, or an electric signal) to notify an outside (For example, a user) of a failure status or a previous status of failure for the power module 100 by a sound and so on.

Figure 2A:
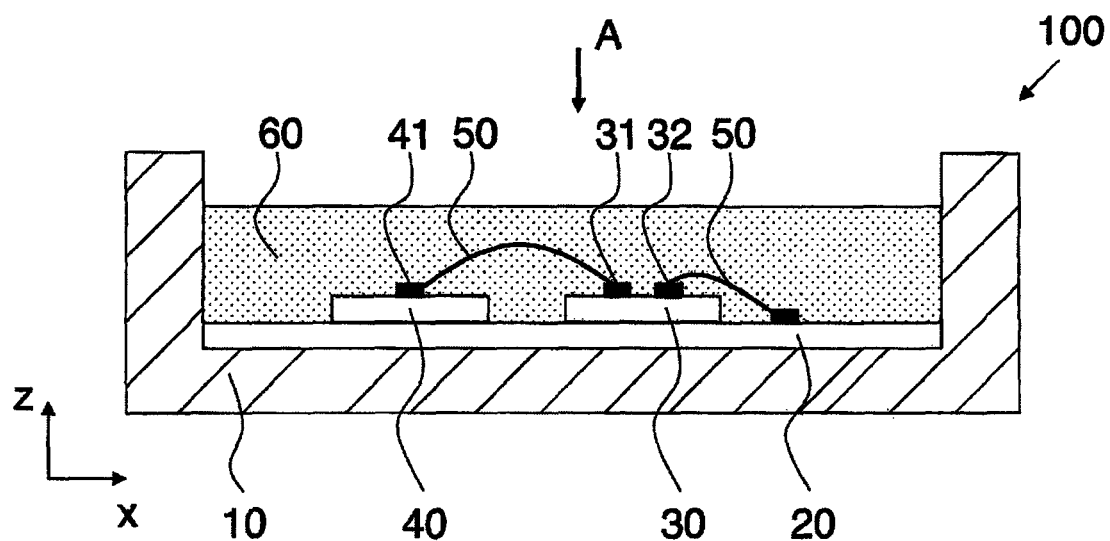
FIGS. 2A and 2B are schematic diagrams of a power module of the electronic apparatus according to the first embodiment.
Figure 2B:
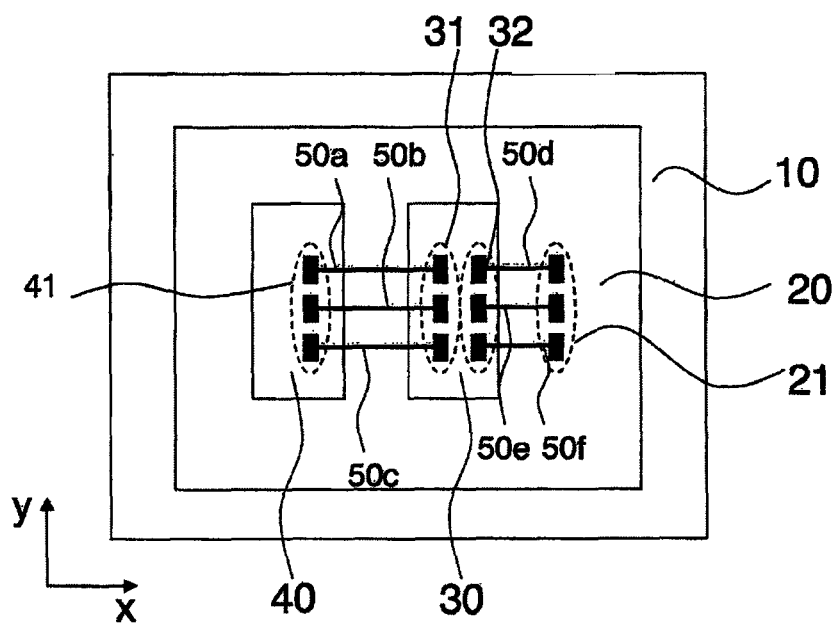

FIGS. 2A and 2B are schematic diagrams of the power module 100. FIG. 2A is a sectional plan of the power module 100, and FIG. 2B is a plan of the power module 100 viewed from an arrow direction A in FIG. 2A.

As shown in FIGS. 2A and 2B, the power module 100 includes a housing 10, an insulated substrate 20, a first device 30, a second device 40, first wires 50a, 50c, 50d, 50f and second wires 50b, 50e as wires 50, and a silicon gel 60. Here, the first wires 50a and 50d are represented as a first wire in claims, the first wires 50c and 50f are represented as a second wire in claims, and the second wires 50b and 50e are represented as a third wire in claims.

The housing 10 is a case of the power module 100, and, as the material, for example, a resin is used. In the housing 10, the insulated substrate 20, the first device 30, the second device 40, the first wires 50a, 50c, 50d, 50f and second wires 50b, 50e, and the silicon gel 60, are put in.

The insulated substrate 20 is, for example, an insulated circuit board formed with a material such as a ceramic. On a surface of the insulated substrate 20, a wiring pattern is formed with a conductive material such as a copper or tungsten. This wiring pattern has a function to maintain an electric connection inside the power module 100 or the electric connection between inside and outside the power module 100. On the surface of the insulated substrate 20, a plurality of electrodes 21 is formed along y-axis direction.

The first device 30 is a power device such as an IGBT (Insulated Gate Bipolar Transistor). The first device 30 is joined to the insulated substrate 20 by solder bonding. On a surface of the first device 30, a plurality of electrodes 31 and a plurality of electrodes 32 are formed along y-axis direction. Here, a plurality of electrodes 21 and the plurality of electrodes 32 are disposed so that a space and a position thereof are aligned. Furthermore, respective electrodes 21 and 32 facing along x-axis direction are aligned so that each pair of electrodes is formed in almost parallel. Here, among each pair of electrodes 21 and 32 disposed in almost parallel in FIG. 2B, a pair of electrodes at the upper side along y-direction is a first pair of electrodes, and a pair of electrodes at the lower side along y-direction is a second pair of electrodes. Between the first pair of electrodes and the second pair of electrodes, a third pair of electrodes is disposed in almost parallel therewith.

The second device 40 is, for example, a diode having a function of rectification. The second device 40 is mounted to the insulated substrate 20 by solder bonding. On a surface of the second device 40, a plurality of electrodes 41 is formed along y-axis direction. Here, the plurality of electrodes 31 on the first device 30 and the plurality of electrodes 41 on the second device 40 are disposed so that a space and a position thereof are aligned. Furthermore, respective electrodes 31 and 41 facing along x-axis direction are aligned so that each pair of electrodes is formed in almost parallel. Here, among each pair of electrodes 31 and 41 disposed in almost parallel in FIG. 2B, a pair of electrodes at the upper side along y-direction is a fourth pair of electrodes, and a pair of electrodes at the lower side along y-direction is a fifth pair of electrodes. Between the fourth pair of electrodes and the fifth pair of electrodes, a sixth pair of electrodes is disposed in almost parallel therewith.

Moreover, the second device 40 is not limited to the diode. Various devices electrically connected with the first device 30 may be the second device 40. Furthermore, "almost parallel" means that two pairs of electrodes adjacently disposed do not cross in a space between the two pairs of electrodes.

The first wires 50$d$ and 50$f$ are respective conductive metals electrically connecting between the first pair of electrodes and between the second pair of electrodes. The first wires 50$a$ and 50$c$ are respective conductive metals electrically connecting between the fourth pair of electrodes and between the fifth pair of electrodes. Furthermore, the second wire 50$e$ is a conductive metal electrically connecting between the third pair of electrodes, and the second wire 50$b$ is a conductive metal electrically connecting between the sixth pair of electrodes. Briefly, as to the first embodiment, among the first wires and the second wires, 50$a$, 50$b$ and 50$c$ are conductive metals electrically connecting between the first device 30 and the second device 40. Furthermore, 50$d$, 50$e$ and 50$f$ are conductive metals electrically connecting between the first device 30 and the insulated substrate 20. As a material of the wire 50, for example, aluminum can be used. Furthermore, the first wires 50$a$, 50$c$, 50$d$, 50$f$ and the second wires 50$b$, 50$e$ have a convex shape along z-axis direction.

For example, the first wires 50$a$, 50$c$, 50$d$, 50$f$ and the second wires 50$b$, 50$e$ are bonded to each electrode by ultrasonic bonding.

The silicon gel 60 is potted in the housing 10, and covers at least the first wires 50$a$, 50$c$, 50$d$, 50$f$ and the second wires 50$b$, 50$e$. The silicon gel 60 prevents a short circuit due to contact between adjacent wires, degradation due to change of an environment such as moisture, and change of characteristics.

Moreover, here, the silicon gel is explained as one example. However, gelatinous material having at least insulation and mechanical strength (For example, Young's modulus is 1 kPa~1 MPa) to prevent the wire from moving due to vibration, may be used.

In FIG. 1, the break detection unit 210 is electrically connected to at least one of the first wires 50$a$ and 50$c$ or at least one of the first wires 50$d$ and 50$f$ via a wiring of the insulated substrate 20. The break detection unit 210 detects a break (including a previous status thereof) of the first wires 50$a$, 50$c$, 50$d$, 50$f$. In order to detect the break, first, the break detection unit 210 applies an imperceptible electric current (For example, 0.01 A) through the first wires 50$a$, 50$c$, 50$d$, 50$f$ connected therewith. Then, by measuring electric characteristics (For example, an electric resistance or impedance) of the first wires 50$a$, 50$c$, 50$d$, 50$f$ and by comparing the electric characteristics with a predetermined threshold, the break detection unit 210 detects that at least one of the first wires 50$a$, 50$c$, 50$d$, 50$f$ is broken (or a previous status thereof). This detection may be arbitrarily or periodically performed. For example, this detection may be performed at the timing when a power source starts to supply or completes, and periodically performed in another time. As a result, the status at the timing immediately after the power module starts to be used or the status at timing when the power module completes to be used, and the status while the power module is being used, can be detected in time series.

As an example, when the break detection unit 210 measures an electric resistance, the break detection unit 210 compares a value of the electric resistance with a first threshold and a second threshold (larger than the first threshold) previously stored in the storage device 300. Here, if the value of the electric resistance is larger than (or equal to) the first threshold and smaller than the second threshold, the break detection unit 210 decides that the first wires 50$a$, 50$c$, 50$d$, 50$f$ are under a previous status of break. Furthermore, if the value of the electric resistance is larger than (or equal to) the second threshold, the break detection unit 210 decides that the first wires 50$a$, 50$c$, 50$d$, 50$f$ are broken. Moreover, according to setting of the threshold (For example, a reciprocal number of the electric resistance), if the value of the electric resistance is smaller than the threshold, the break detection unit 210 may decide broken status of the first wires 50$a$, 50$c$, 50$d$, 50$f$. Furthermore, if the value of the electric resistance is larger than (or smaller than) the threshold, the break detection unit 210 may detect a broken status of the first wires 50$a$, 50$c$, 50$d$, 50$f$. In this case, the break detection unit 210 decides that the electronic apparatus 1 is under a status (or a previous status) of failure. Furthermore, the output device 400 notifies a user or an external device of a decision result of the break detection unit 210.

When an external force such as vibration acts on the electronic apparatus 1, the silicon gel 60 vibrates inside the housing 10 by inertial force. In this case, the first wires 50$a$, 50$c$, 50$d$, 50$f$ and the second wires 50$b$, 50$e$ are transformed by dragging with moving of the silicon gel 60. Especially, when the vibration acts along a direction (y-axis direction in FIG. 2B) almost perpendicular to a drawing direction of the first wires 50$a$, 50$c$, 50$d$, 50$f$ and the second wires 50$b$, 50$e$, each wire largely transforms. Furthermore, a moving amount of the silicon gel 60 of a region where a disposition density of the wire 50 is high is different from a moving amount of the silicon gel 60 of a region where a disposition density of the wire 50 is low. In the region where the disposition density of the wire 50 is low, the moving amount of the silicon gel 60 is larger.

Briefly, in comparison with a distance along a direction perpendicular to a drawing direction between wires 50 adjacently disposed, if a distance between the first wires 50$a$, 50$c$, 50$d$, 50$f$ (disposed at the outside among wires 50 disposed in parallel) and an inner wall of the housing 10 is large, the first wires 50$a$, 50$c$, 50$d$, 50$f$ transforms larger than the second wires 50$b$, 50$e$. Here, height of the disposition density is defined as length of a distance between wires 50 adjacently disposed. Briefly, when a distance between wires 50 adjacently disposed is longer, the disposition density thereof becomes lower. On the other hand, when a distance between wires 50 adjacently disposed is shorter, the disposition density thereof becomes higher. Furthermore, when wires 50 adjacently disposed does not exist, i.e., when the wires 50 are not adjacently disposed along a direction perpendicular to a drawing direction of the wires 50, height of the disposition density is defined as length of a distance between respective wires 50 and an inner wall of the housing 10 along a direction perpendicular to a drawing direction of the respective wires 50.

Accordingly, as mentioned-above, the first wires 50a, 50c, 50d, 50f are set as wires (dummy wires) for break-detection to connect with the break detection unit 210, a break status of the first wires 50a, 50c, 50d, 50f is detected. In this case, the second wires 50b, 50e are set as wires (signal lines) functionally necessary for the electronic apparatus 1. As a result, by detecting break status of the first wires 50a, 50c, 50d, 50f, danger of break of the second wires 50b, 50e can be previously estimated. Furthermore, a previous status of break for the second wires 50b, 50e can be informed to a user or an external device.

Moreover, in the first embodiment, the first wires 50a, 50c, 50d, 50f (disposed at the outside of all wires 50) are explained as dummy wires for break-detection. However, any of the first wires 50a, 50c, 50d, 50f (For example, 50a, 50d) may be used as dummy wires for break-detection. In this case, other first wires 50b, 50f can be used as signal lines. Furthermore, dummy wires for break-detection may be commonly used as signal lines, or may be electrically independent from signal lines.

Furthermore, a plurality of electrodes disposed along y-direction is explained as one example. However, one of each pair of electrodes may be formed as one body and the other of each pair of electrodes may be formed as one body. Briefly, electrodes 21, 31, 32, 41 may be respectively formed as one body.

According to the electronic apparatus 1 of the first embodiment, by detecting a break status of the first wire, a break status of the second wire can be previously decided. As a result, reliability of electrical connection of the wire (signal line) can be improved. Furthermore, before the electronic apparatus 1 is unable to be used or performance thereof degrades, a status of the electronic apparatus 1 can be informed to a user or an external device.

The Second Embodiment

Figure 3:
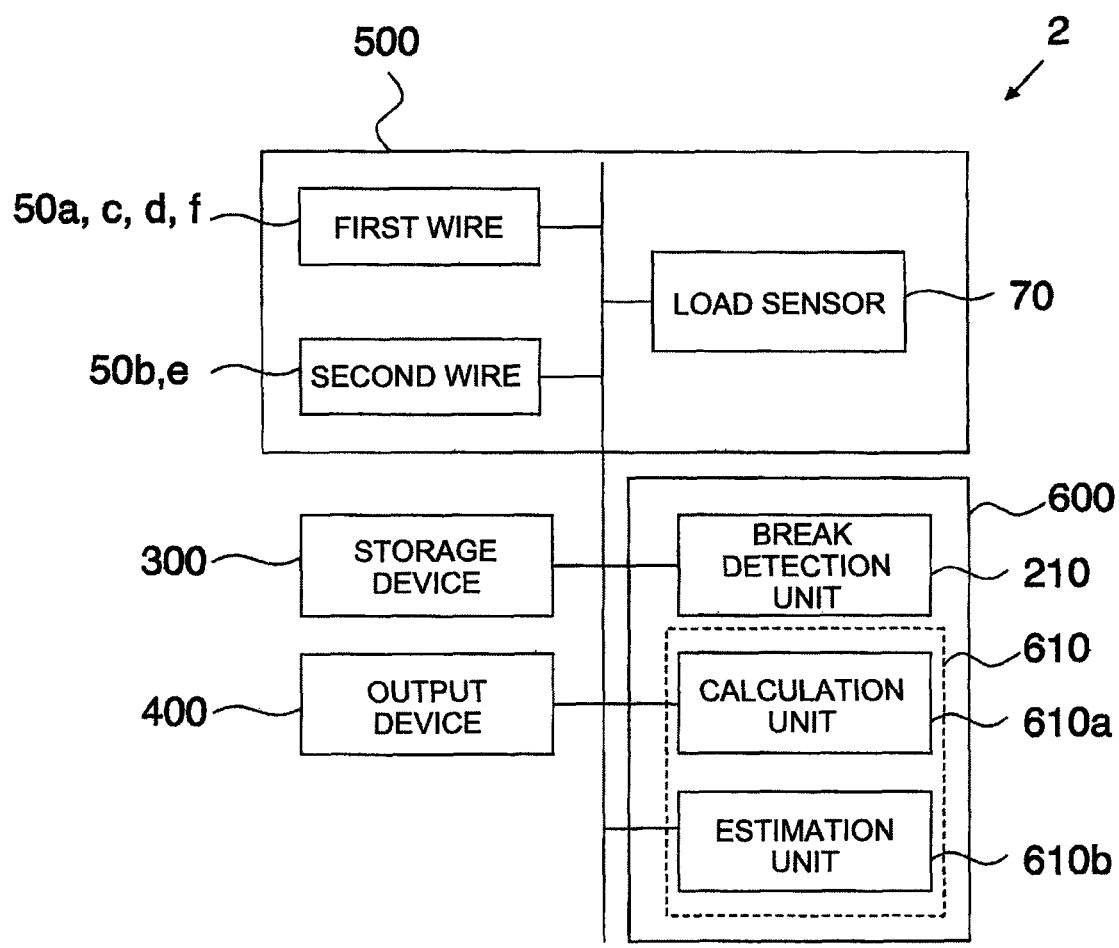
FIG. 3 is a block diagram of an electronic apparatus according to the second embodiment.
Figure 4A:
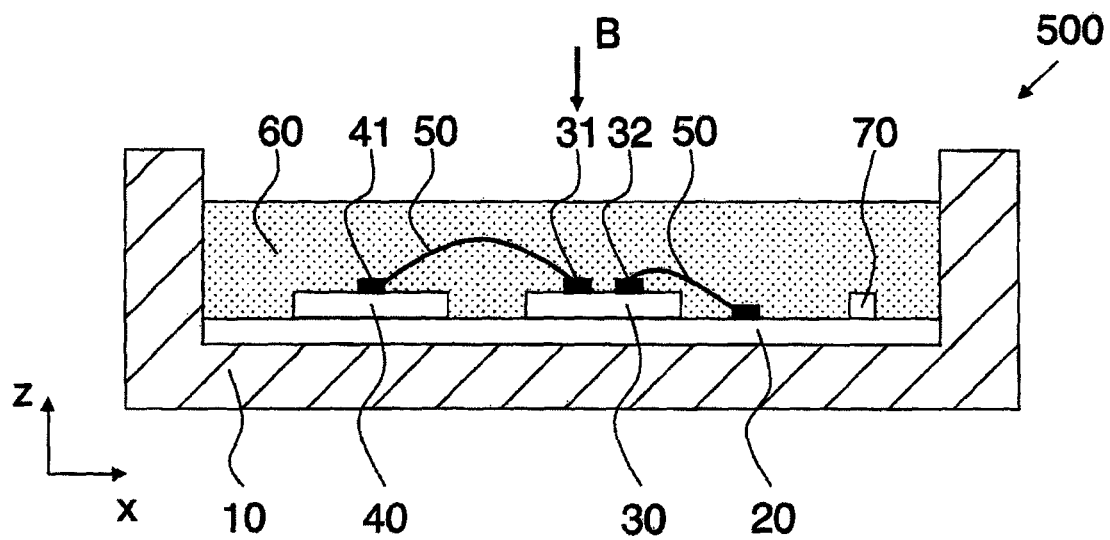
FIGS. 4A and 4B are schematic diagrams of a power module of the electronic apparatus according to the second embodiment.
Figure 4B:
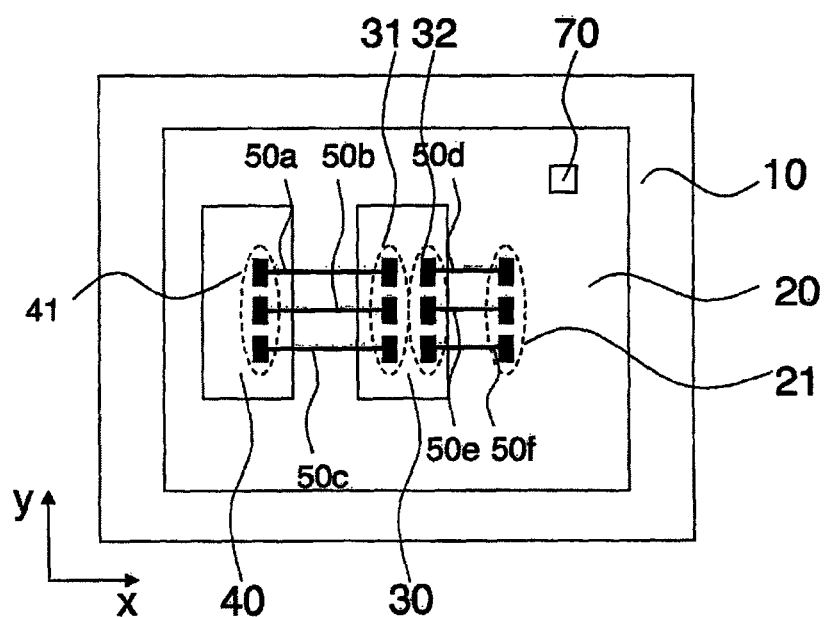

FIG. 3 is a block diagram of an electronic apparatus 2 according to the second embodiment. FIGS. 4A and 4B are schematic diagrams of a power module 500. FIG. 4A is a sectional plan of the power module 500, and FIG. 4B is a plan of the power module 500 viewed from an arrow direction B in FIG. 4A. Moreover, as to the same component as the electronic apparatus 2 in FIG. 1 and the power module 100 in FIGS. 2A and 2B, the same sign is assigned, and explanation thereof is omitted.

In the second embodiment, the power module 500 includes a load sensor 70, and a computation device 600 includes a fatigue life estimation unit 610. This feature is different from the electronic apparatus 1 in FIG. 1. The fatigue life estimation unit 610 includes a calculation unit 610a and an estimation unit 610b.

In general, as to a metal such as an aluminum used for the wire 50, between a strain amplitude $\Delta\epsilon$ and the number of repeat $N_f$ of the strain amplitude $\Delta\epsilon$ to break, following relationship exists.

$$N_f = \alpha \cdot \Delta\epsilon^{-\beta} \quad (1)$$

Here, $\alpha$ and $\beta$ are parameters representing fatigue characteristics of a material, and have values peculiar to the material. In general metallic material, $\beta$ is approximately 0.4~0.7.

In the second embodiment, by previous simulation or experiment, a relationship between a load (temperature amplitude, acceleration amplitude) acting on the wire 50 and a strain amplitude occurred at the wire 50 is examined, and stored into the storage device 300. Then, by using a time history of the load detected by the load sensor 70, a fatigue life of the wire 50 is accurately estimated. In the second embodiment, the storage device 300 stores a relationship equation to convert temperature amplitude to strain amplitude.

For example, the load sensor 70 is set inside the power module 500 (the housing 10), and detects a time history of the load acting on the wire 50 in the power module 500. Moreover, this load affects change of internal stress (or change of strain) of the wire 50. Briefly, this load gives a metal fatigue to the wire 50, which is temperature, acceleration and so on. As the load sensor 70, for example, a thermistor to detect a time history of temperature in the power module 500, or MEMS (Micro Electro Mechanical Systems) acceleration sensor of capacitance type to detect a time history of acceleration acting on the wire 50, can be used. Moreover, time history information of the load detected by the load sensor 70 is stored in the storage device 300. Hereinafter, as the load sensor 70, a thermistor is used.

After the break detection unit 210 detects a break status of any of the first wires 50a, 50c, 50d, 50f, the fatigue life estimation unit 610 estimates a fatigue life of the wire 50 by using time history information of temperature (detected by the load sensor 70) and a relationship equation (stored in the storage device 300) to convert the temperature amplitude to the strain amplitude.

Figure 7:
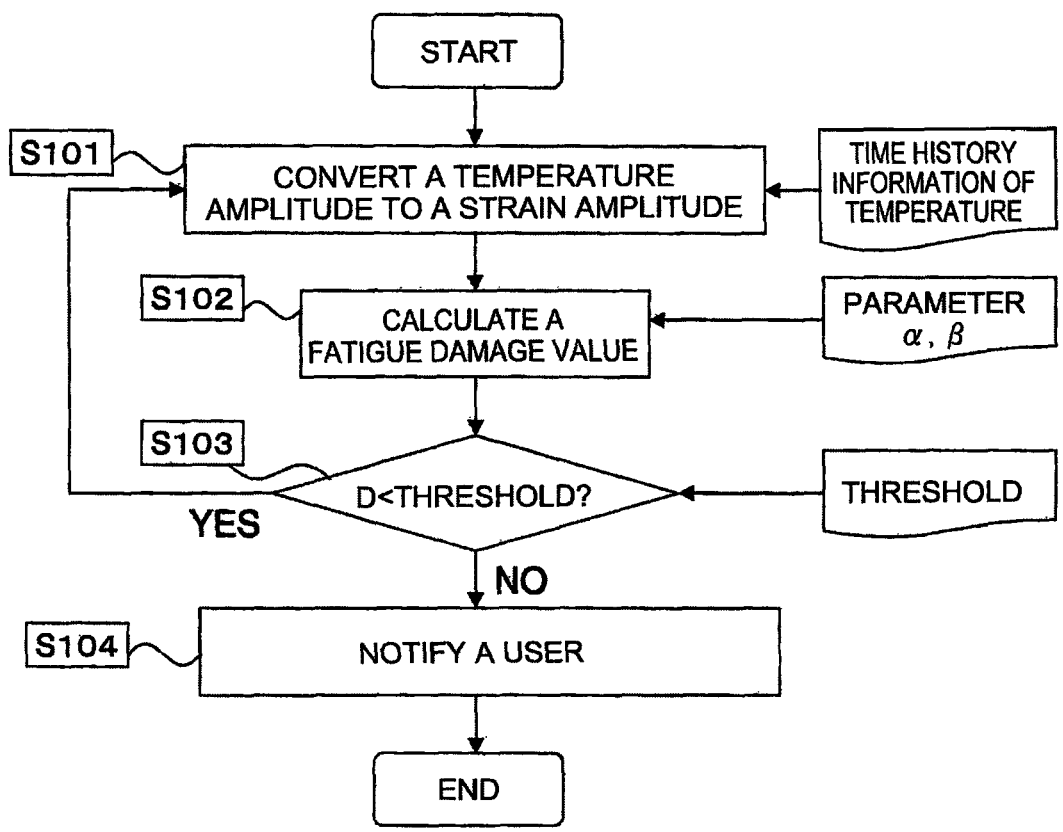
FIG. 7 is a flow chart of processing of a fatigue life estimation unit according to the second embodiment.

Hereinafter, by referring to a flow chart of FIG. 7, operation of the fatigue life estimation unit 610 is explained.

Figure 5:
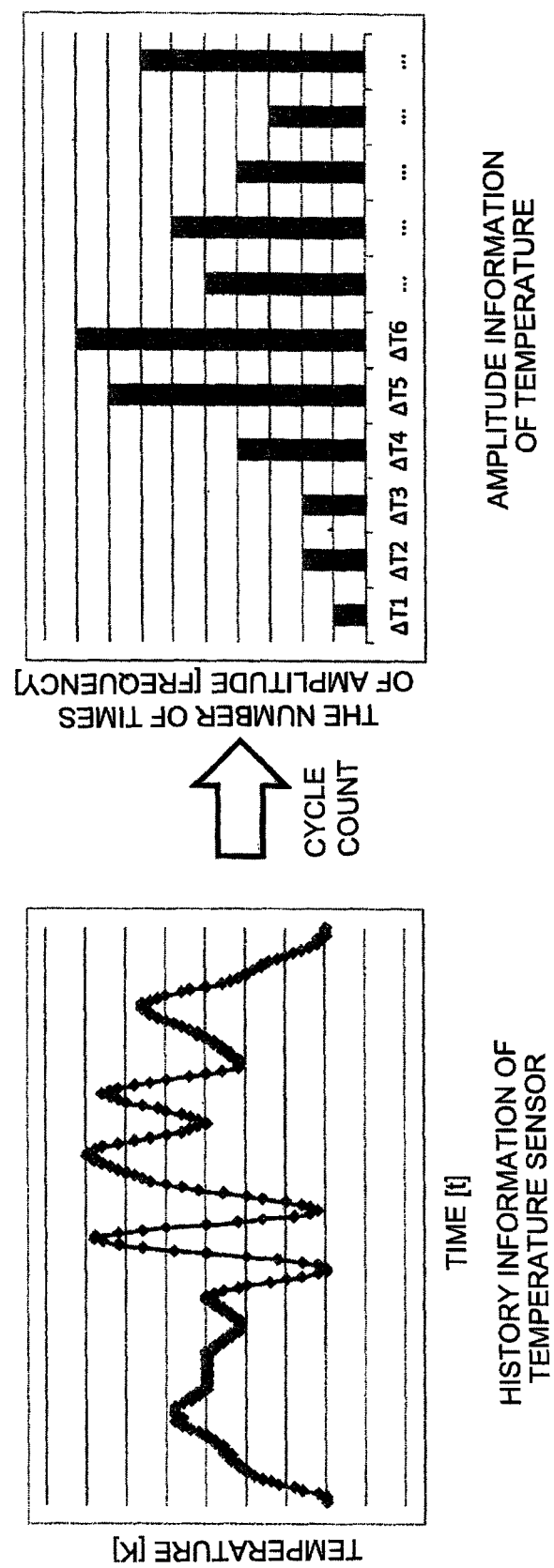
FIG. 5 is one example of a graph showing occurrence frequency of temperature amplitude.

As to time history information of temperature acquired by the load sensor 70, for example, by applying an algorithm such as cycle count, the calculation unit 610a counts the number of times of amplitude of temperature as shown in FIG. 5. Furthermore, by referring to a table stored in the storage device 300, the calculation unit 610a converts temperature amplitude (same as that in FIG. 5) to strain amplitude as shown in FIG. 6 (S101).

Figure 6:
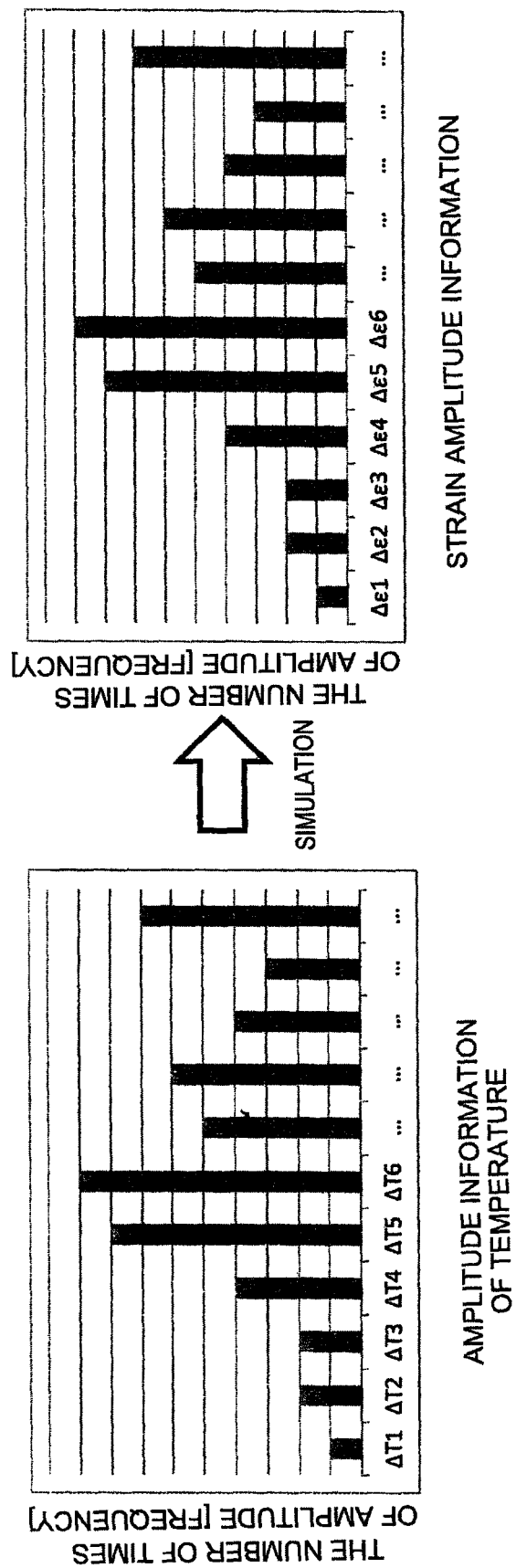
FIG. 6 is one example of a graph showing occurrence frequency of strain amplitude.

By using parameters $\alpha$ and $\beta$ acquired from the storage device 300 and the strain amplitude acquired as shown in FIG. 6, the calculation unit 610a calculates a fatigue damage value D of the wire 50 by following equation (S102). In the equation (2), an index i is an integral number larger than (or equal to) 1 and smaller than (or equal to) n.

$$N_{fi} = \alpha \cdot \Delta\epsilon_i^{-\beta}$$

$$D = 1/N_{f1} + 1/N_{f2} + \ldots + 1/N_{fi} + \ldots + 1/N_{fn} \quad (2)$$

Here, when the fatigue damage value is near 1, the wire 50 is decided to be broken (or a previous status of break). Accordingly, by comparing the fatigue damage value D with a predetermined threshold (For example, by expecting safety ratio 20%, 0.8), the estimation unit 610b estimates a fatigue life of the wire 50 (S103). Moreover, estimation of the fatigue life represents decision that, when the fatigue damage value D is larger than (or equal to) the threshold, the wire 50 is under a previous status of break (fatigue life thereof has passed). Moreover, according to setting of the threshold (For example, a reciprocal number of the fatigue damage value), if the fatigue damage value is smaller than the threshold, the fatigue life of the wire 50 may be decided. Furthermore, if the fatigue damage value is larger than (or smaller than) the threshold, the fatigue life of the wire 50 may be decided.

When the fatigue damage value D is larger than (or equal to) the threshold, the output device 400 notifies a user or an external device of a failure status or a previous status of failure for the power module 500 (S104). When the fatigue damage value D is smaller than the threshold, processing is returned to S101 and steps of S101~S103 are repeatedly executed. Moreover, above-mentioned processing (S101~S104) may be executed for signal lines 50b, 50e only, or may be executed for wires 50 including dummy wires unbroken.

According to the electronic apparatus 2 of the second embodiment, a fatigue life of the wires can be estimated. As a result, reliability of electrical connection of the wires (signal lines) can be improved.

The Third Embodiment

Figure 8:
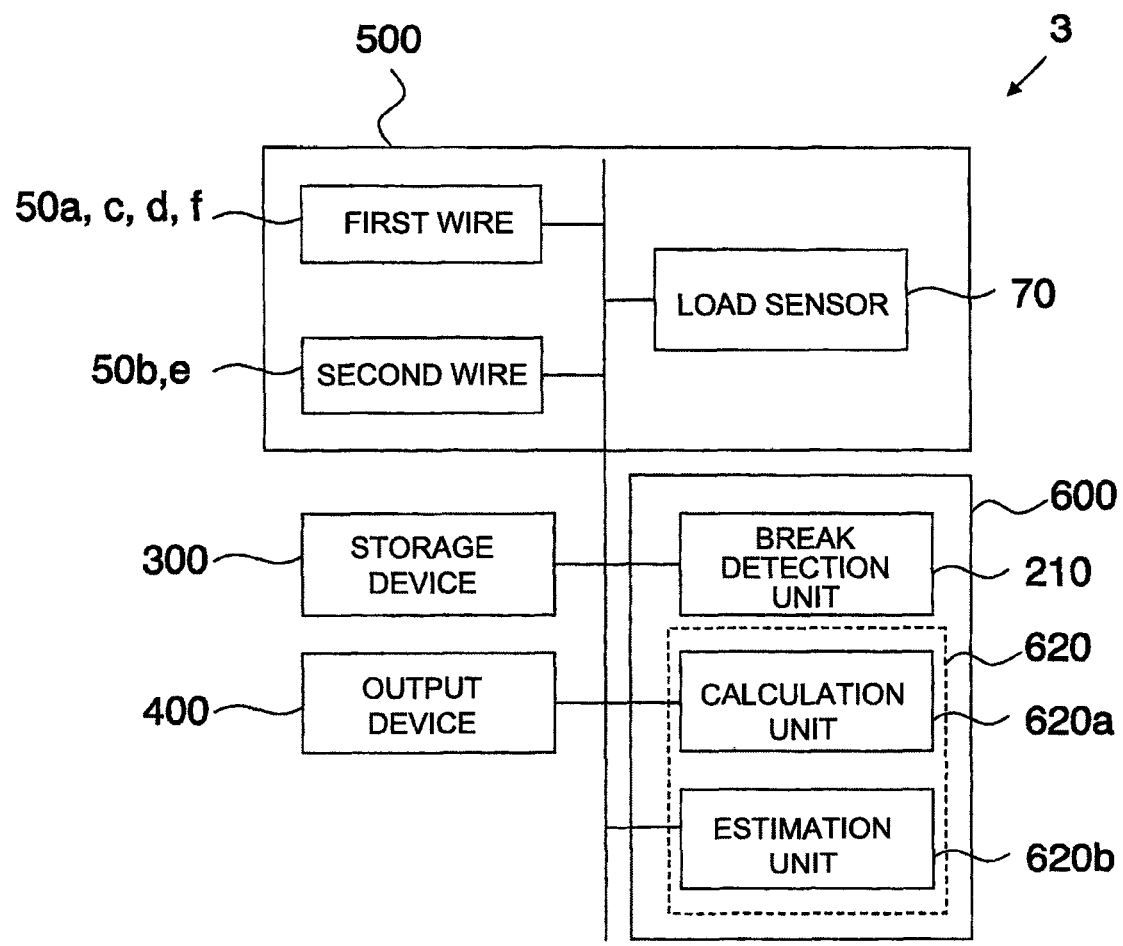
FIG. 8 is a block diagram of an electronic apparatus according to the third embodiment.

FIG. 8 is a block diagram of an electronic apparatus 3 according to the third embodiment. As to the same component as the electronic apparatus 2 in FIG. 3, same sign is assigned, and explanation thereof is omitted.

Due to detection error of the load sensor 70 or influence of individual difference of the wires 50, before or after the fatigue damage value (calculated by the fatigue life estimation unit 610) is equal to 1 as an estimated fatigue damage value to break, the first wires 50a, 50c, 50d, 50f are often broken.

In the third embodiment, after the break detection unit 210 detects a break status of any of the first wires 50a, 50c, 50d, 50f, by using a fatigue damage value of which error is modified based on the estimated fatigue damage value of the first wires 50a, 50c, 50d, 50f to break, a fatigue life estimation unit 620 accurately estimates a fatigue life of the wire 50. The fatigue life estimation unit 620 includes a calculation unit 620a and an estimation unit 620b. Moreover, the estimated fatigue damage value to break is stored in the storage device 300.

Here, the case that a dummy wire 50a is broken is explained as one example. Hereinafter, a fatigue damage value of wires 50a~50f at the timing when the dummy wire 50a is broken is represented as $D_a$~$D_f$.

Figure 9:
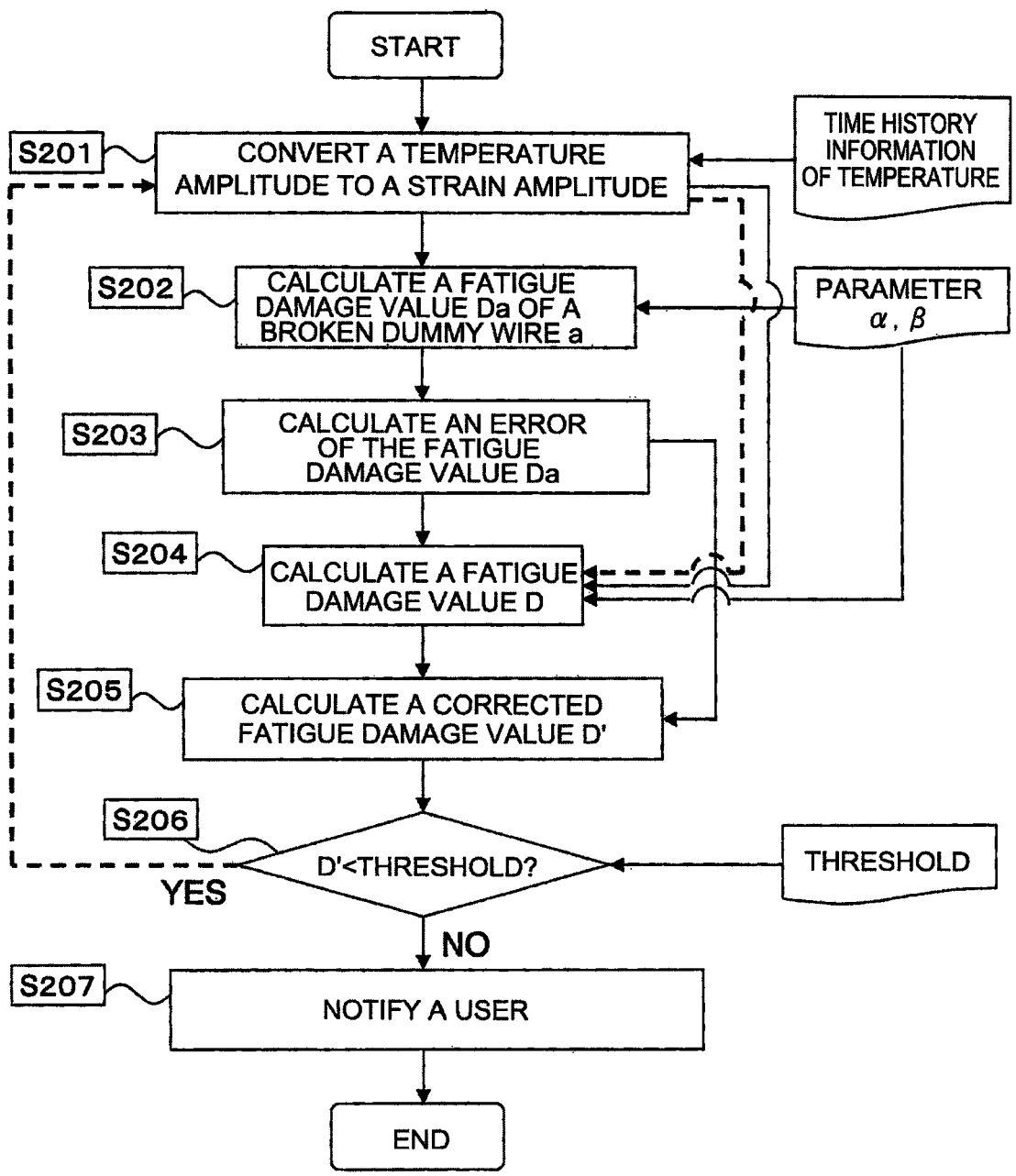
FIG. 9 is a flow chart of processing of a fatigue life estimation unit according to the third embodiment.

Hereinafter, by referring to a flow chart of FIG. 9, operation of the fatigue life estimation unit 620 is explained.

As to time history information of temperature acquired by the load sensor 70, by applying an algorithm such as cycle count in the same way as the second embodiment, the calculation unit 620a converts temperature amplitude to strain amplitude (S201). Then, at timing when a dummy wire 50a is broken, the calculation unit 620a calculates a fatigue damage value $D_a$ of the broken dummy wire 50a by using α and β acquired from the storage device 300 (S202).

Here, in the third embodiment, because the estimated fatigue to break is 1, a reciprocal number $1/D_a$ of the fatigue damage value $D_a$ represents a ratio of an error of the fatigue damage value Da. Accordingly, by assuming that fatigue damage values $D_b$~$D_f$ of wires 50b~50f except for the dummy wire 50a have an error with the same ratio, the calculation unit 620a corrects the fatigue damage values $D_b$~$D_f$ of wires 50b~50f.

Concretely, the calculation unit 620a calculates a reciprocal number $1/D_a$ of the fatigue damage value $D_a$ calculated for the broken dummy wire 50a as an error (S203). Furthermore, the calculation unit 620a calculates fatigue damage values $D_b$~$D_f$ for other wires 50b~50f in the same way (S204). Then, by multiplying the fatigue damage values $D_b$~$D_f$ with the error $1/D_a$, the calculation unit 620a calculates corrected fatigue damage values $D_b'$~$D_f'$ (S205). By comparing the corrected fatigue damage values $D_b'$~$D_f'$ with the threshold, the estimation unit 620b estimates a fatigue life of wires 50b~50f (S206). Calculation of the corrected fatigue damage values $D_b'$~$D_f'$ may be executed only if $D_a$ is smaller than (or equal to) 1. By correcting the fatigue damage value only if $D_a$ is smaller than (or equal to) 1, corrected fatigue damage values $D_b'$~$D_f'$ are always larger than corresponding fatigue damage values $D_b$~$D_f$. Accordingly, the fatigue life can be safely estimated as a shorter fatigue life When the corrected fatigue damage values $D_b'$~$D_f'$ are larger than (or equal to) the threshold, the output device 400 notifies a user or an external device of a failure status or a previous status of failure for the power module 500 (S207).

When the corrected fatigue damage values $D_b'$~$D_f'$ are smaller than the threshold, processing is returned to S201, and steps of S201, S204~S206 (a dotted line in FIG. 9) are repeatedly executed.

According to the electronic apparatus 3 of the third embodiment, by using the fatigue damage value of which the error is corrected, a fatigue life of the wire can be accurately estimated.

(Modifications)

As to the wire 50 according to modifications, a shape of the first wires 50a, 50c, 50d, 50f is different from a shape of the second wires 50b, 50e. In order to preferentially improve a reliability of electrical connection of the second wires 50b, 50e (having a function of the electronic apparatus), the first wires 50a, 50c, 50d, 50f had better be broken before the second wires 50b, 50e are broken.

Accordingly, in the modifications, so that the first wires 50a, 50c, 50d, 50f are transformed larger than the second wires 50b, 50e by movement of the silicon gel 60, the first wires 50a, 50c, 50d, 50f having a shape accepting a larger load or a lower stiffness than the second wires 50b, 50e.

Figure 10A:
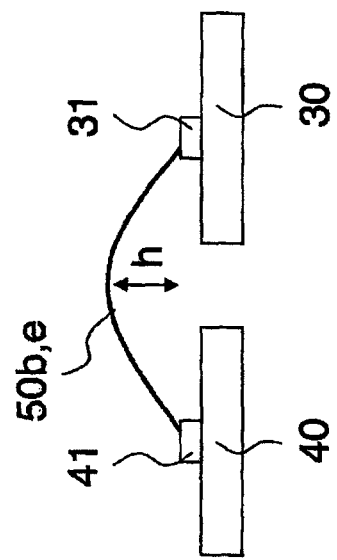
FIGS. 10A~10D are schematic diagrams of wires according to modifications of the embodiments.
Figure 10B:
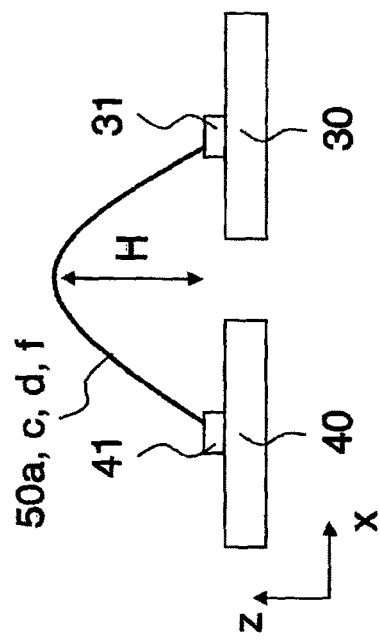

As shown in examples of FIGS. 10A and 10B, a height H of the first wires 50a, 50c, 50d, 50f is higher than a height h of the second wires 50b, 50e. Here, the first wires 50a, 50c, 50d, 50f has a shape apt to accept a force from a surrounding silicon gel. Moreover, as this height, for example, a distance between a surface of each electrode and a peal of the convex wire 50 along z-axis direction is used.

Figure 10C:
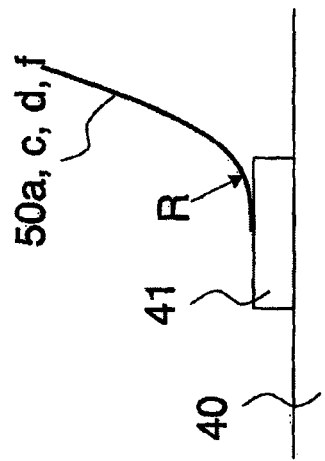

Furthermore, as shown in another example of FIG. 10C, by setting a weight 80 to a part of the first wires 50a, 50c, 50d, 50f, the first wires 50a, 50c, 50d, 50f have a heavier mass and a shape apt to accept an inertial force by an external force. The weight 80 may be set by welding a metal onto the first wires 50a, 50c, 50d, 50f, or by partially thickening a thickness of the first wires 50a, 50c, 50d, 50f.

Figure 10D:
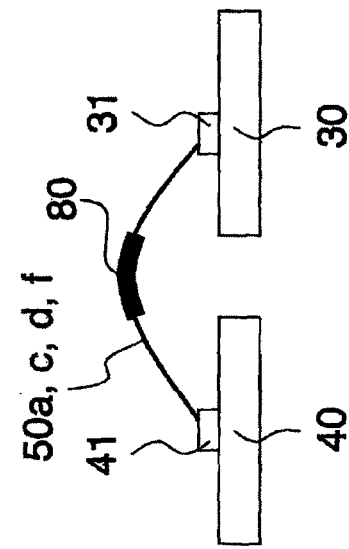

Furthermore, as shown in the other example of FIG. 10D, a radius of curvature of the first wires 50a, 50c, 50d, 50f at a connection part with each electrode is smaller than a radius curvature of the second wires 50b, 50e. As a result, a stiffness of the first wires 50a, 50c, 50d, 50f lowers.

According to the electronic apparatus of at least one of above-mentioned embodiments, a reliability of electrical connection of the wire can be improved.

While certain embodiments have been described, these embodiments have been presented by way of examples only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic apparatus comprising:
a first pair of electrodes having a first electrode and a second electrode;
a second pair of electrodes disposed in parallel with the first pair, the second pair having a third electrode and a fourth electrode;
a third pair of electrodes disposed between the first pair and the second pair in parallel with the first pair and the second pair, the third pair having a fifth electrode and a sixth electrode;
a first wire electrically connecting the first electrode and the second electrode;
a second wire electrically connecting the third electrode and the fourth electrode;
a third wire electrically connecting the fifth electrode and the sixth electrode;
a gel covering the first wire, the second wire, and the third wire;
a first detection unit configured to determine a break or an impending break of the third wire by detecting a break of at least one of the first wire and the second wire;
a storage to store a parameter representing a fatigue characteristic of the third wire;
a second detection unit configured to detect a load applied to the third wire;
a calculation unit configured to calculate a fatigue damage value of the third wire by using the fatigue characteristic parameter and the load after the break status is detected; and
an estimation unit configured to estimate a fatigue life of the third wire by using the fatigue damage value; wherein,
the storage stores parameters representing a fatigue characteristic of the first wire and the second wire, and an estimated fatigue damage value of the first wire and the second wire when the first wire and the second wire are respectively broken;
the second detection unit detects a load applied to the first wire and the second wire respectively; and
when the break status of one of the first wire and the second wire is detected,
the calculation unit:
calculates a fatigue damage value of the one by using the first and second wire fatigue characteristic parameters and the load of the one,
calculates an error between the calculated fatigue damage value and the estimated fatigue damage value of the one, and
corrects the fatigue damage value of the third wire by using the error.

2. The apparatus according to claim 1, wherein
the first electrode, the third electrode, and the fifth electrode, are formed as one body, and
the second electrode, the fourth electrode, and the sixth electrode, are formed as one body.

3. The apparatus according to claim 1, wherein
the first detection unit decides that the electronic apparatus is under a failure status or an impending status of failure when the break is detected,
further comprising:
an output unit to output the status of the electronic apparatus decided by the first detection unit.

4. The apparatus according to claim 1, wherein
a stiffness of the first wire and the second wire is lower than a stiffness of the third wire.

5. A method for deciding a failure in an electronic apparatus, wherein the electronic apparatus comprises
a first pair of electrodes having a first electrode and a second electrode,
a second pair of electrodes disposed in parallel with the first pair, the second pair having a third electrode and a fourth electrode,
a third pair of electrodes disposed between the first pair and the second pair in parallel with the first pair and the second pair, the third pair having a fifth electrode and a sixth electrode,
a first wire electrically connecting the first electrode and the second electrode,
a second wire electrically connecting the third electrode and the fourth electrode,
a third wire electrically connecting the fifth electrode and the sixth electrode,
a storage storing parameters representing a fatigue characteristic of the first wire and the second wire, and an estimated fatigue damage value of the first wire and the second wire when the first wire and the second wire are respectively broken,
a load detection unit detecting a load applied to the first wire and the second wire,
and
a gel covering the first wire, the second wire, and the third wire;
the method comprising:
determining a break or an impending break of the third wire by detecting a break of at least one of the first wire and the second wire;
deciding that the electronic apparatus is under a failure status or an impending status of failure when the break status is detected;
when the break status of one of the first wire and the second wire is detected, calculating a fatigue damage value of the one by using the fatigue characteristic parameters and the load of the one;
calculating an error between the fatigue damage value and the estimated fatigue damage value of the one; and
correcting the fatigue damage value of the third wire by using the error.

6. A method for estimating a fatigue life in an electronic apparatus, wherein the electronic apparatus comprises
a first pair of electrodes having a first electrode and a second electrode,
a second pair of electrodes disposed in parallel with the first pair, the second pair having a third electrode and a fourth electrode,
a third pair of electrodes disposed between the first pair and the second pair in parallel with the first pair and the second pair, the third pair having a fifth electrode and a sixth electrode,
a first wire electrically connecting the first electrode and the second electrode,
a second wire electrically connecting the third electrode and the fourth electrode,
a third wire electrically connecting the fifth electrode and the sixth electrode,
a gel covering the first wire, the second wire, and the third wire,
a storage storing a parameter representing a fatigue characteristic of the third wire, parameters representing a fatigue characteristic of the first wire and the second wire, and an estimated fatigue damage value of the first wire and the second wire when the first wire and the second wire are respectively broken, and a load detection unit configured to detect a load applied to the third wire and to detect a load applied to the first wire and the second wire;

the method comprising:

determining a break or an impending break of the third wire by detecting a break of at least one of the first wire and the second wire;

calculating a fatigue damage value of the third wire by using the fatigue characteristic parameter and the load;

when the break status of one of the first wire and the second wire is detected, calculating a fatigue damage value of the one by using the fatigue characteristic parameters and the load of the one;

calculating an error between the fatigue damage value and the estimated fatigue damage value of the one;

correcting the fatigue damage value of the third wire by using the error; and estimating a fatigue life of the third wire by using the fatigue damage value.

7. An electronic apparatus comprising:

a first pair of electrodes having a first electrode and a second electrode;

a second pair of electrodes disposed in parallel with the first pair, the second pair having a third electrode and a fourth electrode;

a first wire electrically connecting the first electrode and the second electrode;

a second wire electrically connecting the third electrode and the fourth electrode;

a gel covering the first wire and the second wire;

a storage that stores a parameter representing a fatigue characteristic of the second wire;

a first detection unit that detects a break status of the first wire;

a second detection unit that detects a load applied to the second wire;

a calculation unit that, when the break status of the first wire is detected, calculates a fatigue damage value of the second wire by using the parameter and the load; and an estimation unit that estimates a fatigue life of the second wire by using the fatigue damage value, wherein the storage stores parameters represent a fatigue characteristic of the first wire, and an estimated fatigue damage value of the first wire when the first wire is broken, the second detection unit detects a load applied to the first wire, and the calculation unit, when the break status of the first wire is detected:

calculates a fatigue damage value of the first wire by using the first wire fatigue characteristic parameter and the load of the first wire, calculates an error between the calculated fatigue damage value and the estimated fatigue damage value, and corrects the fatigue damage value of the second wire by using the error.

* * * * *